United States Patent
Narimatsu

(10) Patent No.: US 6,596,603 B1
(45) Date of Patent: Jul. 22, 2003

(54) SEMICONDUCTOR DEVICE AND MANUFACTURING METHOD THEREOF, AND REGISTRATION ACCURACY MEASUREMENT ENHANCEMENT METHOD

(75) Inventor: Koichiro Narimatsu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/570,463

(22) Filed: May 12, 2000

(30) Foreign Application Priority Data

Dec. 6, 1999 (JP) .......................................... 11-346079

(51) Int. Cl.⁷ ............................................. H01L 21/76
(52) U.S. Cl. ................... 438/401; 438/462; 438/975; 257/797
(58) Field of Search ................ 438/401, 462, 438/975; 257/797

(56) References Cited

U.S. PATENT DOCUMENTS 5,892,291 A     4/1999   Narimatsu et al.
5,952,134 A  *  9/1999   Hwang
6,083,807 A  *  7/2000   Hsu ............................ 438/401

FOREIGN PATENT DOCUMENTS

| JP | 6-176996 | | 6/1994 |
| JP | 9-74063 | | 3/1997 |
| JP | 11-288869 | | 10/1999 |
| JP | 2000010254 A | * | 1/2000 |

* cited by examiner

*Primary Examiner*—Long Pham
(74) *Attorney, Agent, or Firm*—McDermott, Will & Emery

(57) ABSTRACT

A semiconductor device with an enhanced registration accuracy photo-mask used for manufacturing the device and a registration accuracy enhancement method are provided, by detecting lens aberration which causes problems in the process of manufacturing a semiconductor device. The semiconductor device includes an auxiliary mark including an inner mark having stepped portions with four sides as stepped portions to be detected and an outer mark having stepped portion as stepped portions to be detected, provided approximately parallel to stepped portions along four sides of the inner mark.

2 Claims, 4 Drawing Sheets

SEMICONDUCTOR DEVICE AND MANUFACTURING METHOD THEREOF, AND REGISTRATION ACCURACY MEASUREMENT ENHANCEMENT METHOD

BACKGROUND OF THE INVENTION

1. Field of the Invention

The present invention relates to a photo-mask used for a semiconductor device and a manufacturing method thereof, and a registration accuracy enhancement method thereof.

2. Description of the Background Art

A registration accuracy measurement mark has conventionally been used for measuring registration accuracy of each layer in a semiconductor device manufacturing process. The registration accuracy measurement mark is usually formed in several layers, that is, in each of the stacked inherent layers of the device which are the object of actual registration accuracy measurement, at a predetermined position on a semiconductor substrate. When measuring registration accuracy, the positions of stepped portions, i.e. edges of the registration accuracy measurement mark are detected, and the distance between the two detected stepped portions, i.e., edges is measured, whereby the amount of displacement of the registration between the registration accuracy measurement marks in two layers is calculated. The difference between the amount of displacement of the registration of the two opening patterns in the inherent layers formed on a photo-mask and the calculated amount of displacement of the two stepped portions of the registration accuracy measurement marks is thereby measured as a registration error in a manufacturing process.

Though the above-described stepped portions of the registration accuracy measurement mark are detected using a registration accuracy measurement device, the registration error itself cannot be accurately measured because the displacement of the pattern, i.e., transfer error, caused by lens aberration is not considered.

A method of measuring registration accuracy considering a lens aberration is described in Japanese Patent Laying-Open No. 9-74063. In the technology described in the laid-open application, registration accuracy measurement marks are formed in two layers in the same shape as two inherent layers to be measured for actual registration accuracy, so that the amount of the pattern displacement, i.e., transfer error, of the two inherent layers due to aberration and that of the registration accuracy measurement marks due to aberration come to be the same. The pattern displacement of the inherent patterns caused by aberration and that of the registration accuracy measurement marks caused by aberration are thereby offset. Therefore, only the registration error is detected in the registration accuracy measurement method described in Japanese Patent Laying-Open No. 9-74063.

In a registration accuracy measurement method using only a conventionally used registration accuracy measurement mark, however, the pattern displacement itself caused by lens aberration is not calculated to modify a lens unit (hereinafter, the modification of a lens unit means both the adjustment of the lens unit and the correction of a lens) so as to reduce the aberration. Thus, the registration error caused by lens aberration is not corrected to enhance the registration accuracy in a semiconductor device manufacturing process.

The following method, however, is generally used to evaluate the amount of aberration. First, a resist film 100, provided with a pattern in which lines and spaces are alternately formed, is formed as shown in FIGS. 7 and 8. The line-widths of L1 and L2 at the opposite ends of resist film 100 are measured, for example, using SEM (Scanning Electron Microscope). The line-width abnormal value due to comatic aberration is generally calculated by the following equation:

$$\text{Line-width abnormal value}=(L1-L2)/(L1+L2) \tag{1}$$

From the equation (1), the line-width abnormal value can be calculated according to the measurement results of the above-described widths L1 and L2.

In this method, only a pattern in which lines and spaces are alternately formed is used for resist film 100, so that only the measurement error of the pattern line-width caused by aberration can be detected when using normal SEM. That is, a pattern transfer error resulting from the difference in shape between two patterns to be measured due to the aberration can not be detected. Thus, in manufacturing a semiconductor device, a lens unit which is modified to reduce the transfer error of the pattern caused by lens aberration has not been used.

Furthermore, since SEM is used, the measurement time is long and the measurement of the whole lens unit (the entire exposure device) is difficult.

SUMMARY OF THE INVENTION

One object of the present invention is to provide a semiconductor device with registration accuracy enhanced, a photo-mask used for manufacturing the device, and a registration accuracy enhancement method thereof, by detecting lens aberration involved in a semiconductor manufacturing process.

Another object of the present invention is to enable correction of lens aberration by using a normal registration accuracy measurement device.

A semiconductor device according to the invention includes an auxiliary mark for registration accuracy enhancement (hereinafter simply referred to as auxiliary mark) used to detect aberration of a lens or lenses used in an exposure step in the manufacturing of a semiconductor device so as to modify the lens unit to reduce the lens aberration. The auxiliary mark includes an inner mark forming four sides of a first virtual rectangle when viewed two-dimensionally and an outer mark forming four sides of a second virtual rectangle analogous to the first virtual rectangle and having the same intersection point of diagonals as the first virtual rectangle when viewed two-dimensionally. The inner and the outer marks are formed to have stepped portions, which stepped portions belong to one same layer and can be detected by a registration accuracy measurement device.

Such a structure allows the auxiliary mark to have the outer mark on the same layer as the inner mark. Thus, in the exposure step using a photo-mask for forming the auxiliary mark, the inner and outer marks can be formed not affected by a registration error caused by overlaying two layers.

Therefore, when the patterns of the inner and outer marks formed on a semiconductor substrate are compared with those opened in the photo-mask, an error in the distance between stepped portions of the respective inner and outer marks will approximately be the same as a pattern transfer error caused by lens aberration in the exposure step using the photo-mask, since an alignment error caused when using an exposure device such as a stepper is sufficiently small.

As a result, lens aberration due to the pattern difference between the inner and outer marks can be detected at a position where the auxiliary mark is provided, by using a normal registration accuracy measurement device. By modifying the lens unit based on the detected result to reduce the lens aberration, the registration accuracy can be enhanced for each layer to be positioned one upon another.

Further, in a semiconductor device according to the invention, the outer mark having the stepped portions may be formed as a box pattern, a line pattern, or a hole pattern.

In a semiconductor device according to the invention, the inner mark having the stepped portions may be formed as a box pattern, a line pattern, or a hole pattern.

Alternatively, in a semiconductor device according to the invention, the outer mark having the stepped portions may be formed as a positive pattern (i.e., a pattern on which the resist remains) or a negative pattern (i.e., a pattern from which the resist is eliminated).

In a semiconductor device according to the invention, the inner mark having stepped portions may also be formed as a positive pattern or a negative pattern.

Alternatively, in a semiconductor device according to the invention, the auxiliary mark may preferably be formed to be a plurality of marks dispersed across the entire exposure region on a semiconductor substrate.

Such a structure in that auxiliary marks are dispersed on the semiconductor substrate allows detection of a pattern transfer error caused by the lens aberrations at respective positions. This leads to a more accurate enhancement of the registration accuracy for each layer placed one upon another in a semiconductor device manufacturing step, as the lens unit is modified to reduce the lens aberrations at respective positions.

In a semiconductor device according to the invention, more preferably, a plurality inner marks are formed to have a number of steps having different sizes.

Such a structure enables detection of the aberration depending on the sizes of inner marks, as a plurality of inner marks having different sizes are dispersed on a semiconductor substrate. As a result, registration accuracy for each overlaid layer can accurately be enhanced in the process of manufacturing a semiconductor device, as the lens unit is modified to reduce the lens aberration for the different sizes of the inner marks.

In a semiconductor device according to the invention, more preferably, a plurality of outer marks are formed to have a number of steps having different sizes.

Such a structure enables detection of the aberration depending on the sizes of outer marks, as a plurality of outer marks having different sizes are dispersed on a semiconductor substrate. As a result, registration accuracy for each overlaid layer can accurately be enhanced in the process of manufacturing a semiconductor device, as the lens unit is modified to reduce the lens aberration for the different sizes of the outer marks.

In a semiconductor device according to the invention, more preferably, the plurality of inner marks are formed to include a box pattern, a line pattern and a hole pattern.

Such a structure enables detection of the aberration that varies depending on the pattern shapes, as the plurality of auxiliary marks, in which the inner marks include a box pattern, a line pattern, and a hole pattern, are dispersed on a semiconductor substrate. As a result, registration accuracy for each layer can accurately be enhanced in the process of manufacturing a semiconductor device, by modifying a lens unit to reduce the lens aberration for each pattern shape.

Alternatively, in a semiconductor device according to the invention, the plurality of outer marks are formed to include a box pattern, a line pattern and a hole pattern.

Such a structure enables detection of the aberration that varies depending on the pattern shapes, as the plurality of auxiliary marks, in which the outer marks include a box pattern, a line pattern, and a hole pattern, are dispersed on a semiconductor substrate. As a result, registration accuracy for each layer can accurately be enhanced in the process of manufacturing a semiconductor device, by modifying a lens unit to reduce the lens aberration for each pattern shape.

A photo-mask for manufacturing a semiconductor device according to the present invention is provided with an opening corresponding to the pattern of the auxiliary mark which includes an inner mark forming four sides of a first virtual rectangle when viewed two-dimensionally and an outer mark forming four sides of a second virtual rectangle analogous to the first virtual rectangle and having the same intersection point of diagonals as the first virtual rectangle when viewed two-dimensionally, the inner and outer marks having stepped portions on one same layer, which can be detected by a registration accuracy measurement device.

By using such a photo-mask, a semiconductor device according to the above-described aspects of the present invention can be manufactured.

A method of enhancing the registration accuracy of a semiconductor device according to the invention uses the auxiliary mark which includes an inner mark forming four sides of a first virtual rectangle on a semiconductor substrate when viewed two-dimensionally and an outer mark forming four sides of a second virtual rectangle analogous to the first virtual rectangle and having the same intersecting point of diagonals as the first virtual rectangle when viewed two-dimensionally, the inner and outer marks having stepped portions on one same layer, which can be detected by a registration accuracy measurement device.

The detection of lens aberration by such a method allows the lens unit to be modified to reduce the lens aberration, so that a semiconductor device with an enhanced registration accuracy for each layer placed one upon another can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in conjunction with the drawings in the following.

First Embodiment

Figure 1:
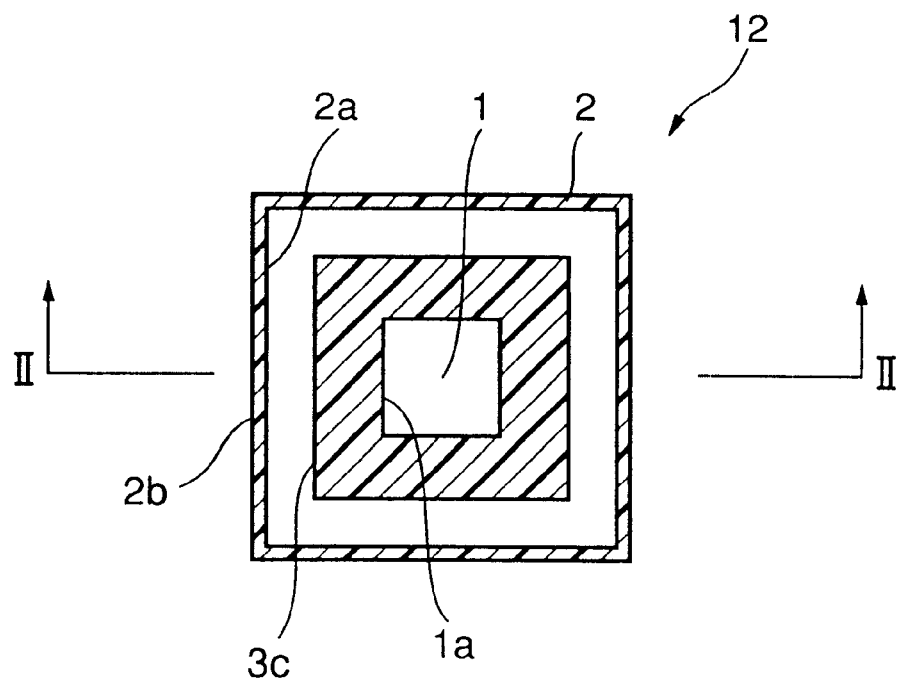
FIG. 1 is a schematic view of a planar structure of an auxiliary mark for detecting the lens aberration, of a semiconductor device according to the first embodiment of the invention.
Figure 2:
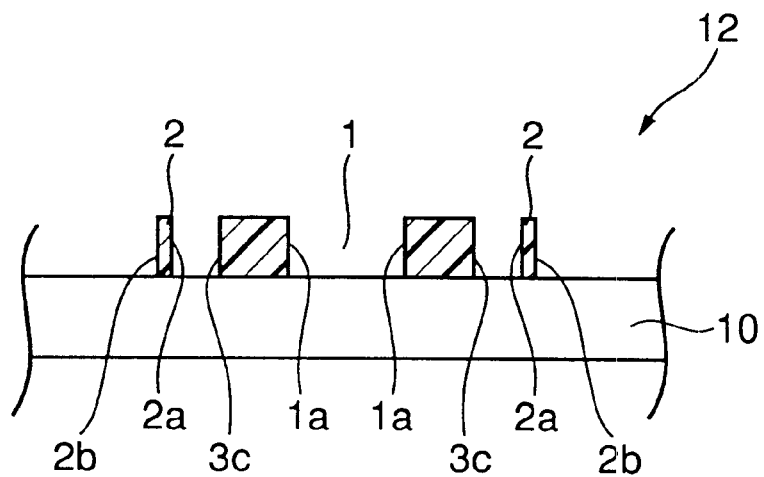
FIG. 2 is a sectional view along line II—II in FIG. 1.

First, a semiconductor device according to the first embodiment is described with reference to FIGS. 1 and 2. A semiconductor device according to the present embodiment includes, as shown in FIGS. 1 and 2, an auxiliary mark 12 for detecting lens aberration on a semiconductor substrate 10. Though auxiliary mark 12 is usually formed on a semiconductor wafer, it may sometimes remain on a semiconductor chip diced out of a semiconductor wafer.

Auxiliary mark 12 includes an inner mark 1, formed on semiconductor substrate 10, having stepped portions 1a of four sides as the stepped portions to be detected and an outer mark 2 formed on the same layer as and surrounding inner mark 1 and having stepped portions 2a, 2b as the stepped portions to be detected, provided approximately parallel to stepped-portions 1a of four sides.

Inner mark 1 is formed to have stepped portions 1a along four sides of a first virtual rectangle on a semiconductor substrate when viewed two-dimensionally. Outer mark 2 is formed to have stepped portions 2a, 2b along four sides of a second virtual rectangle analogous to the first virtual rectangle and having the same intersecting point of diagonals as the first virtual rectangle when viewed two-dimensionally. Furthermore, stepped portions 1a of inner mark 1 and stepped portions 2a, 2b of outer mark are the stepped portions, which stepped portions belong to one same layer and can be detected by a registration accuracy measurement device.

Moreover, inner mark 1 is a box pattern having continuous four sides in which stepped portions 1a are formed by a negative pattern and outer mark 2 has a relatively elongated line pattern with stepped portions 2a, 2b formed by a positive pattern. Though a negative box pattern with stepped portions 1a to be detected is used as the inner mark in this embodiment, a positive box pattern with stepped portions 3c to be detected may also be used. Further, instead of a line pattern formed by a positive pattern used for outer mark 2, a line pattern formed by a negative pattern may also be used.

Though a resist film is normally used as the material of the above-described inner mark 1 and outer mark 2, an insulating layer or a conducting layer may also be used.

Such a structure allows auxiliary mark 12 to have outer mark 2 formed on the same layer as inner mark 1. Thus, in an exposure step using a photo-mask for forming an auxiliary mark, inner mark 1 and outer mark 2 are formed without registration error involved in placing two layers one upon the other. Therefore, when patterns of stepped portions of inner mark 1 and outer mark 2 opened in a photo-mask and those formed on semiconductor substrate 10 are compared, the error in the distance between stepped portions of respective inner and outer marks would be approximately the same as a pattern transfer error caused by lens aberration in an exposure step using a photo-mask, since the error in an exposure device such as a stepper is sufficiently small. As a result, lens aberration depending on the pattern difference between inner mark 1 and outer mark 2 can be detected, by using a normal registration accuracy measurement device, at a position where the auxiliary mark is provided. By modifying a lens unit to reduce the lens aberration based on the detected lens aberration, a registration accuracy enhancement for each layer to be overlaid can be achieved in the process of manufacturing a semiconductor device.

In a semiconductor device according to this embodiment, auxiliary mark 12 may preferably include a plurality of auxiliary marks dispersed across the entire region of semiconductor 10. When forming auxiliary mark 12 on a semiconductor chip in which a semiconductor element is formed, a number of auxiliary marks may be dispersed in a region other than the element forming region.

Such a structure enables detection of pattern displacement (transfer error) due to the lens aberration at each position, as a plurality of auxiliary marks 12 are dispersed on semiconductor substrate 10. As a result, more accurate enhancement of registration accuracy for each layer to be overlaid can be achieved in the process of manufacturing a semiconductor device, as the lens unit is modified to reduce the lens aberration at each position.

In the auxiliary mark described in this embodiment, a plurality of step patterns of inner marks and/or outer marks are preferably formed to include several types of step patterns having different sizes.

Such a structure enables detection of the aberration depending on the size of the auxiliary mark at each position, as a plurality of auxiliary marks 12 having patterns of different sizes are dispersed on semiconductor substrate 10. As a result, more accurate enhancement of registration accuracy for each layer to be overlaid can be achieved in the process of manufacturing a semiconductor device, as the lens unit is modified to reduce the lens aberration for the auxiliary marks having different sizes.

It is also preferred that outer mark 2 and/or inner mark 1 having stepped portions are formed by a pattern including a box pattern, a line pattern, and a hole pattern.

In such a structure, as a box pattern, a line pattern, and a hole pattern are dispersed on a semiconductor substrate in plural, the lens aberration depending on the shapes of the patterns can be detected at respective positions on semiconductor substrate. As a result, more accurate enhancement of registration accuracy for each layer to be overlaid can be achieved in the process of manufacturing a semiconductor device, as the lens unit is modified to reduce the lens aberration for the patterns having different shapes.

Further, for forming the auxiliary mark described in this embodiment, a photo-mask is usually used in which an opening corresponding to the pattern of auxiliary mark 12 is formed.

In a method for enhancing a registration accuracy using auxiliary mark 12 described in this embodiment, a semiconductor device can be manufactured in which more accurately enhanced registration accuracy for each layer to be overlaid is attained, as the lens aberration in the registration measurement is detected and the lens unit is modified to reduce the lens aberration itself.

Second Embodiment

Figure 3:
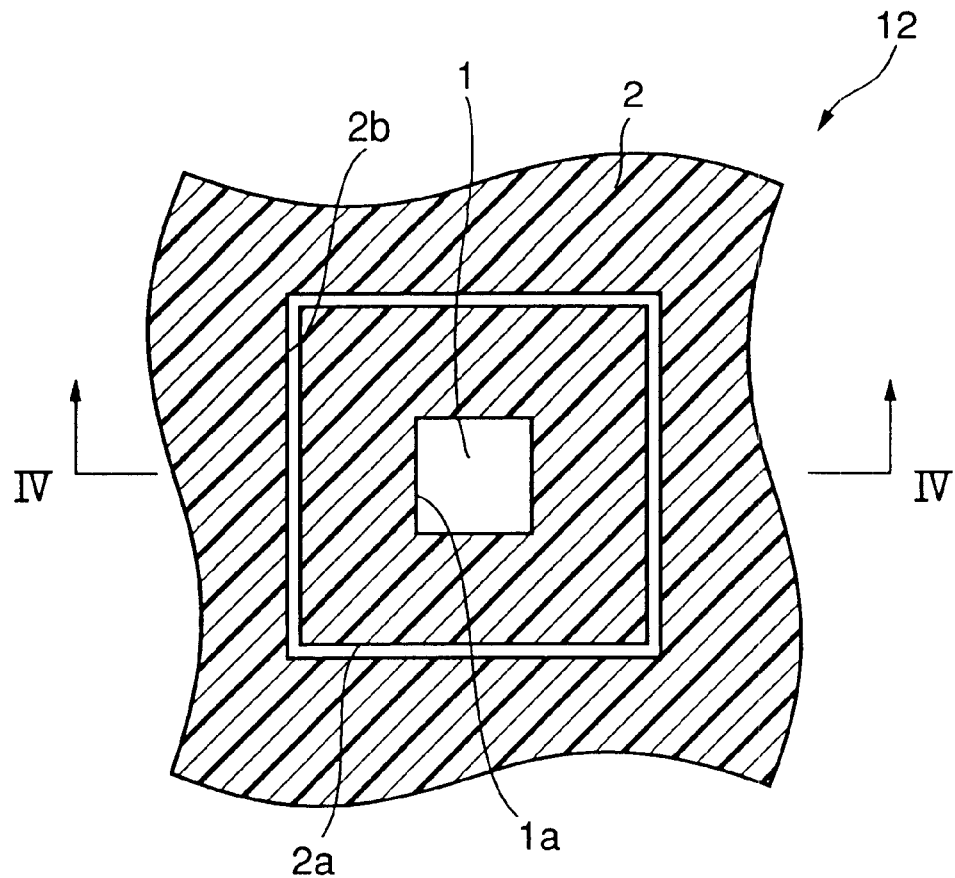
FIG. 3 is a schematic view of a planar structure of an auxiliary mark for detecting the lens aberration, of a semiconductor device according to the second embodiment of the invention.
Figure 4:
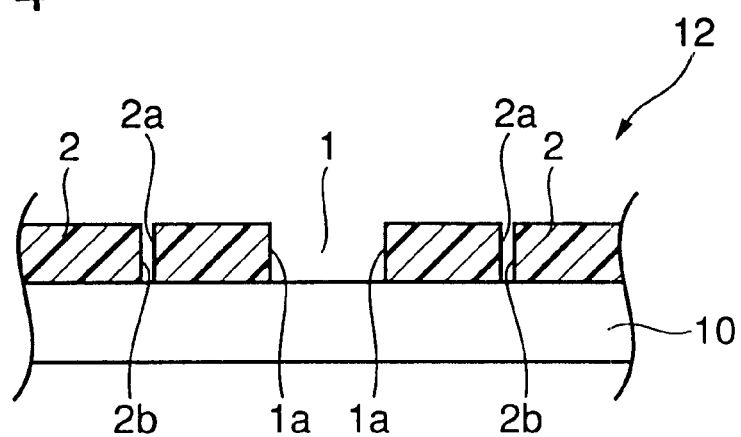
FIG. 4 is a sectional view along line IV—IV in FIG. 3.

A semiconductor device according to the second embodiment of the invention is now described with reference to FIGS. 3 and 4. A semiconductor device according to this embodiment includes auxiliary mark 12 for detecting lens aberration on semiconductor substrate 10 as shown in FIGS. 3 and 4, as in the semiconductor device according to the first embodiment.

Auxiliary mark 12 includes inner mark 1 formed on semiconductor substrate 10 and having continuous stepped portions 1a of four sides as four stepped portions to be detected and outer mark 2 formed of a relatively elongated line pattern provided approximately parallel to the four stepped portions of inner mark 1 and formed on the same layer as, and surrounding inner mark 1, with stepped portions 2a, 2b as stepped portions to be detected.

Inner mark 1 has stepped portions 1a along four sides of a first virtual rectangle on a semiconductor substrate when viewed two-dimensionally. Outer mark 2 has stepped portions 2a, 2b along four sides of a second virtual rectangle analogous to the first virtual rectangle and having the same intersecting point of diagonals as the first virtual rectangle when viewed two-dimensionally. Further, stepped portions 1a of inner mark 1 and stepped portions 2a, 2b of outer mark 2 are the stepped portions provided on one same layer, which can be detected by a registration accuracy measurement device.

Stepped portions 1a of inner mark 1 are formed by a negative box pattern and stepped portions 2a and 2b of outer mark 2 are formed by a positive line pattern.

Such a structure, similar to the above-described first embodiment, enables detection of the lens aberration depending on the shape and size differences between inner mark 1 and outer mark 2, at a position where the auxiliary mark is provided, by using a normal registration accuracy measurement device, since inner mark 1 and outer mark 2 are formed on the same layer. Thus, similar to the semiconductor device according to the first embodiment, registration accuracy can be enhanced for each layer to be overlaid in the process of manufacturing a semiconductor device, as the lens unit is modified to reduce the lens aberration based on the detected lens aberration.

Third Embodiment

Figure 5:
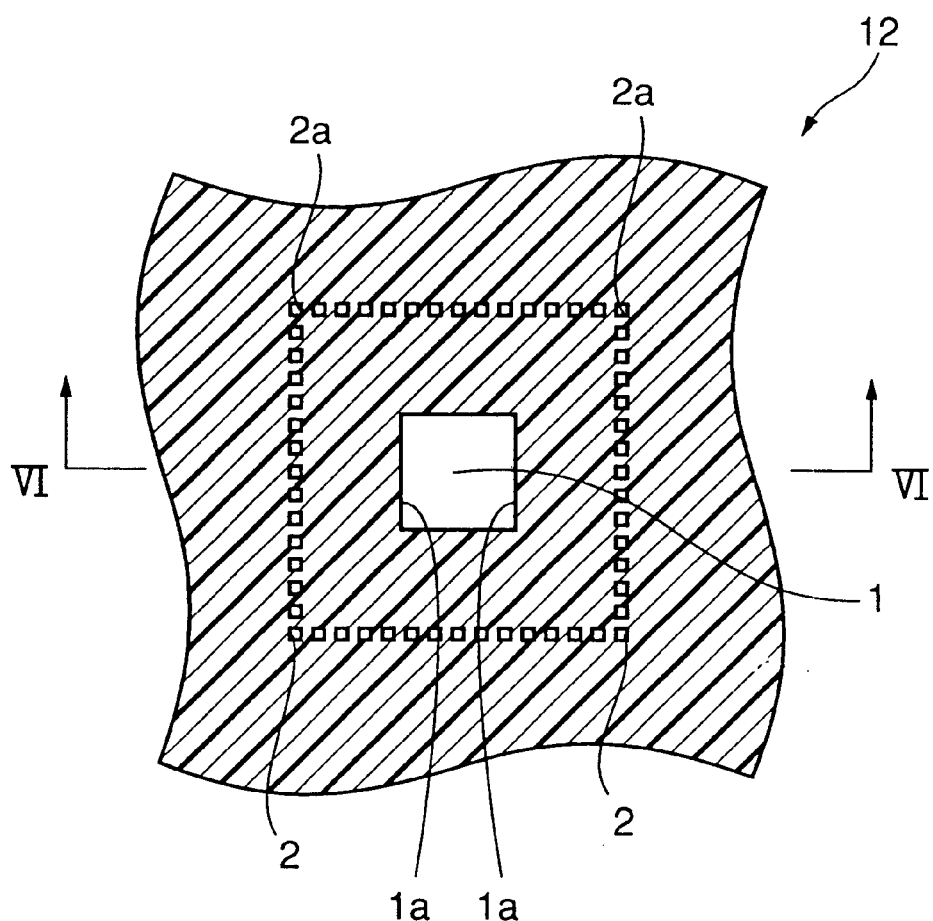
FIG. 5 is a schematic view of a planar structure of an auxiliary mark for detecting lens aberration of a semiconductor device according to the third embodiment of the invention.
Figure 6:
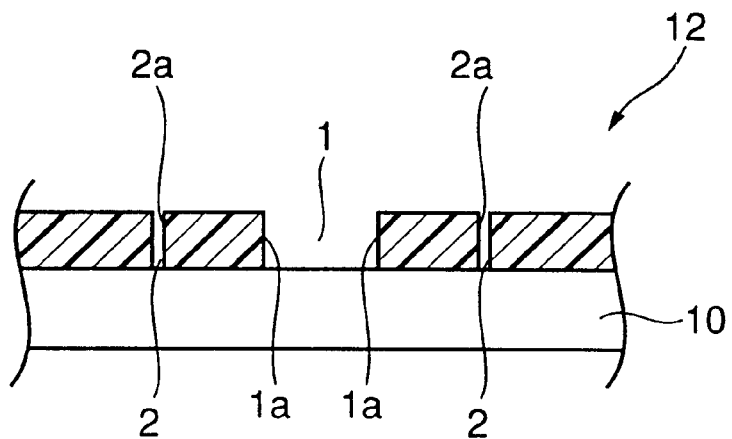
FIG. 6 is a sectional view along line VI—VI in FIG. 5.
Figure 7:
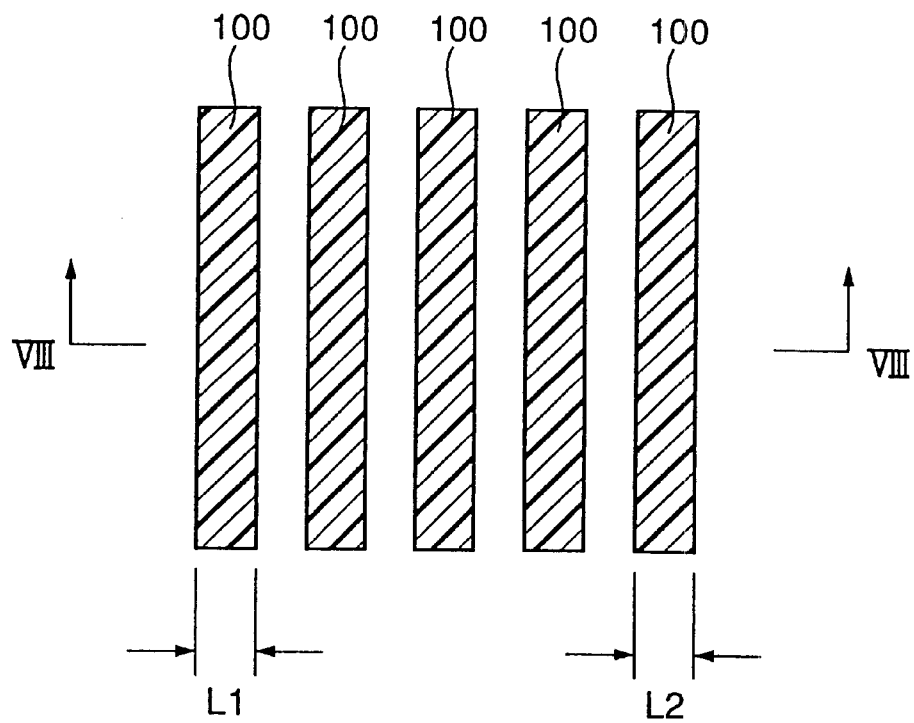
FIG. 7 is a schematic view of a planar structure of a resist pattern used for calculation of line-width abnormal value resulting from a conventional lens aberration.
Figure 8:
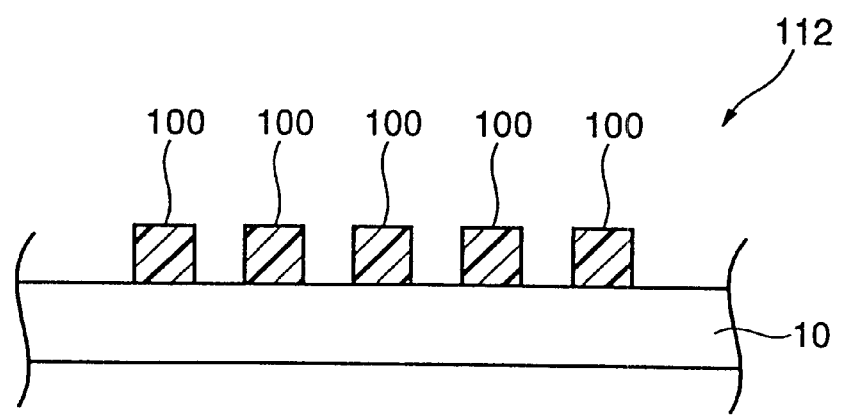
FIG. 8 is a sectional view along VIII—VIII in FIG. 7.

A semiconductor according to the third embodiment of the invention is now described with reference to FIGS. 5 and 6. A semiconductor device according to this embodiment, similar to the semiconductor device according to the first embodiment, includes auxiliary mark 12 for detecting lens aberration on semiconductor substrate 10 as shown in FIGS. 5 and 6.

Auxiliary mark 12 includes inner mark 1 formed on semiconductor substrate 10 having four sides as stepped portions to be detected and outer mark 2 formed on the same layer as and surrounding inner mark 1 and having stepped portions to be detected formed as a plurality of hole patterns provided approximately parallel to the four sides of inner mark 1. The inner and outer marks are integrally formed with the same material.

Inner mark 1 has stepped portions 1a along four sides of a first virtual rectangle on a semiconductor substrate when viewed two-dimensionally. Outer mark 2 has stepped portions 2a along four sides of a second virtual rectangle analogous to the first virtual rectangle and having the same intersecting point as the first virtual rectangle. Furthermore, stepped portions 1a of inner mark 1 and stepped portions 2a of outer mark 2 are the stepped portions which belong to one same layer and can be detected by a registration accuracy measurement device.

Moreover, stepped portions 1a of inner mark 1 are formed by a negative box pattern and stepped portions 2a of the outer mark are formed by a positive hole pattern.

Such a structure enables detection of the lens aberration depending on the pattern difference between inner mark 1 and outer mark 2, at a position where the auxiliary mark is provided, by using a normal registration accuracy measurement device, since inner mark 1 and outer mark 2 are formed on the same layer as in the above-described first embodiment. Thus, similar to a semiconductor device according to the first embodiment, registration accuracy can be enhanced for each layer to be overlaid in the process of manufacturing a semiconductor device, as the lens unit is modified to reduce the lens aberration based on the detected lens aberration.

In the semiconductor device, the photo-mask used for manufacturing the same, and a method for enhancing the registration accuracy thereof according to the above embodiments 1–3, though one example of a pattern has been described for each of inner mark 1 and outer mark 2, any of a box pattern, a line pattern, and a hole pattern can be used for inner mark 1 and outer mark 2 having stepped portions, if each pattern is formed along the four sides of the first and second virtual rectangles, and the same effect is obtained as provided by the semiconductor device, the photo-mask used for manufacturing the same, and the registration accuracy enhancement method according to the first to third embodiments described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of enhancing registration accuracy of a semiconductor device using an auxiliary mark, said auxiliary mark including
an inner mark forming four sides of a first virtual rectangle on a semiconductor substrate when viewed two-dimensionally, and
an outer mark forming four sides of a second virtual rectangle having the same intersecting point of diagonals as said first virtual rectangle when viewed two-dimensionally, wherein the four sides of the first virtual rectangle are parallel to the four sides of the second virtual rectangle, respectively,
said inner mark and said outer mark being formed to have stepped portions, which stepped portions are formed on a common surface of the semiconductor substrate and are formed from a common layer, and can be detected by a registration accuracy measurement device, said method comprising the steps of:
comparing a distance between a stepped portion of the outer mark and a stepped portion of the inner mark formed on the semiconductor substrate with a distance between an opening of a photomask corresponding to the outer mark and an opening of a photomask corresponding to the inner mark;
measuring a pattern transfer error caused by aberration of a lens system in accordance with a difference in the compared distances; and
correcting the lens system using the measured pattern transfer error such that the pattern transfer error caused by aberration of the lens system is reduced.

2. A method of enhancing registration accuracy of a semiconductor device using an auxiliary mark, said auxiliary mark including
an inner mark forming four sides of a first virtual rectangle on a semiconductor substrate when viewed two-dimensionally, and
an outer mark forming four sides of a second virtual rectangle having the same intersecting point of diagonals as said first virtual rectangle when viewed two-dimensionally, wherein the four sides of the first virtual rectangle are parallel to the four sides of the second virtual rectangle, respectively,
said inner mark and said outer mark being formed to have stepped portions, which stepped portions are formed from a common layer, and can be detected by a registration accuracy measurement device, said method comprising the steps of:
comparing a distance between a stepped portion of the outer mark and a stepped portion of the inner mark formed on the semiconductor substrate with a distance between an opening of a photomask corresponding to the outer mark and an opening of a photomask corresponding to the inner mark;
measuring a pattern transfer error caused by aberration of a lens system in accordance with a difference in the compared distances; and
correcting the lens system using the measured pattern transfer error such that the pattern transfer error caused by aberration of the lens system is reduced.

* * * * *